United States Patent [19]
Richards

[11] Patent Number: 4,811,080
[45] Date of Patent: Mar. 7, 1989

[54] MONOLITHIC PIN DIODE AND METHOD FOR ITS MANUFACTURE

[75] Inventor: John G. Richards, San Jose, Calif.

[73] Assignee: FEI Microwave, Inc., Sunnyvale, Calif.

[21] Appl. No.: 151,331

[22] Filed: Feb. 2, 1988

Related U.S. Application Data

[62] Division of Ser. No. 769,911, Aug. 27, 1985, Pat. No. 4,738,933.

[51] Int. Cl.⁴ .................................... H01L 29/12
[52] U.S. Cl. ..................... 357/58; 357/56; 357/68
[58] Field of Search ............... 357/56, 58, 51, 68

[56] References Cited

U.S. PATENT DOCUMENTS 4,301,429 11/1981 Goldman ........................ 357/58
4,518,981 5/1985 Schlupp ........................ 357/15

*Primary Examiner*—William L. Sikes
*Assistant Examiner*—Mark Prenty
*Attorney, Agent, or Firm*—Skjerven, Morrill, MacPherson, Franklin & Friel

[57] ABSTRACT

A monolithic semiconductor device that provides a diode having PIN diode characteristics. The diode has anode and cathode mesas having contacts in substantially the same plane to facilitate automatic bonding. One of the contacts is insulated from its associated mesa and has a conductive layer that extends between the mesas and through an insulating layer to make direct contact with the substrate, thereby isolating the flow of current from any intervening I regions. The conductive layer may include a portion of narrow cross section, to function as a fuse.

12 Claims, 1 Drawing Sheet

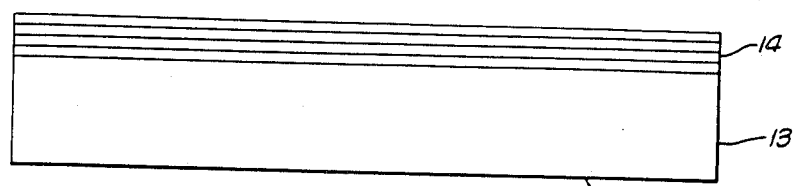
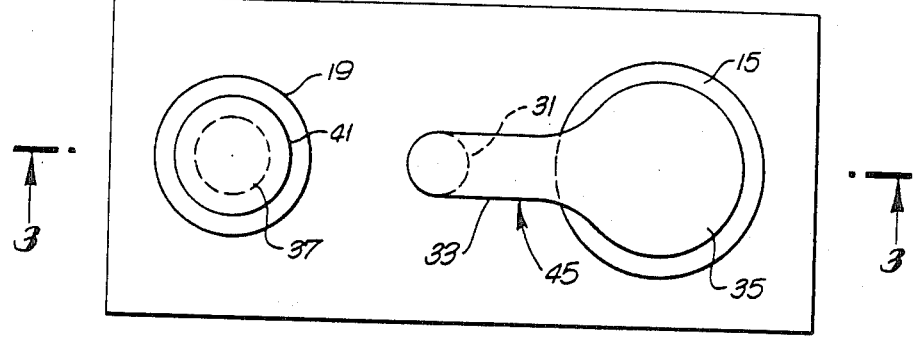
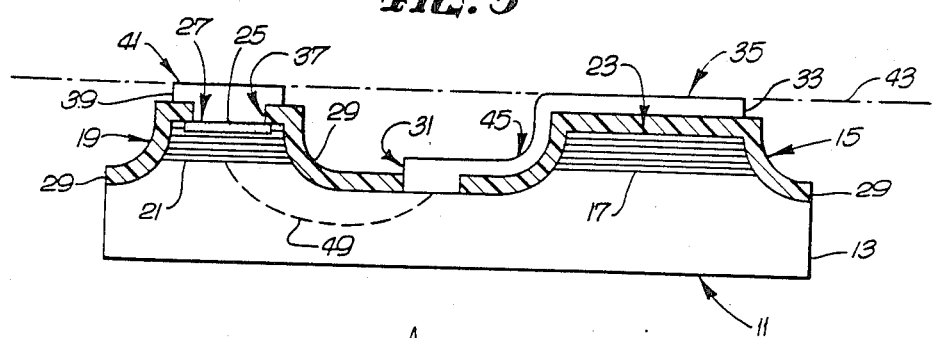
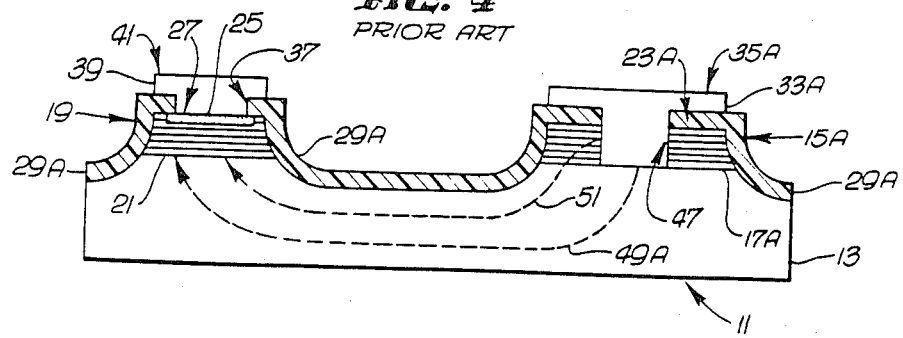

MONOLITHIC PIN DIODE AND METHOD FOR ITS MANUFACTURE

This application is a division of application Ser. No. 06/769,911, filed Aug. 27, 1985 and now U.S. Pat. No. 4,738,933.

BACKGROUND OF THE INVENTION

The present invention relates generally to semiconductors and, more particularly, to diodes fabricated in monolithic semiconductor devices.

An ordinary P-N junction diode comprises a semiconductor having an N region suitably doped to provide negative charge carriers and an adjacent P region suitably doped to provide positive charge carriers. The boundary between these regions defines the P-N junction. A depletion zone, within which there are no free charge carriers, extends a short distance into the semiconductor on both sides of the P-N junction. The depletion zone can be considered as a capacitor having a dielectric defined by the semiconductor material enclosed within the zone, and plates defined by the borders between the depletion zone and the adjacent N and P regions. As a result a P-N diode exhibits capacitive as well as diode characteristics.

If a reverse bias voltage is applied across a P-N diode, the depletion zone widens. As the voltage is increased, so does the width of the depletion zone. Widening the depletion zone is effectively the same as physically increasing the separation between the capacitor plates defined by the depletion zone boundaries, and accordingly the capacitance exhibited by the diode varies with the applied voltage. This voltage-variable capacitance has a negligible effect in most applications of diodes. In some other applications it is even used to advantage. However, the capacitive effect is neither negligible nor advantageous in most microwave diode applications, and hence, like other unwanted stray capacitances, it must be compensated for. Since it is considerably easier to compensate for a fixed stray capacitance than for a variable one, a diode having a capacitance that remains constant offers advantages to the microwave circuit designer. A PIN diode exhibits just such a fixed capacitance, and accordingly PIN diodes are now widely used in microwave applications.

In a PIN diode, a lightly doped intrinsic layer, or I region, is sandwiched between the P and N regions. The P-N junction is defined at the boundary between the I region and one of the other regions, and the depletion zone extends from the P-N junction into the I region. When a reverse bias voltage is applied, the depletion zone expands until it fills the entire width of the I region, but it does not expand further, even if the applied voltage continues to increase. Therefore, the capacitance of the diode stabilizes once the depletion zone has fully occupied the I region. The voltage at which the depletion zone reaches its maximum width is called the "punch-through" voltage, because at that voltage an electric field associated with the depletion zone is said to "punch through" the I region to the region beyond.

Although the use of discrete PIN diodes has become widespread, so far it has not been possible to fabricate PIN diodes in monolithic semiconductor devices. In a prior attempt to fabricate a PIN mesa diode in monolithic form, the desirable stabilization of stray capacitance has not been achieved at microwave frequencies, and the principal advantage of the PIN diode has therefore been lost. Accordingly, there is still a need for a reliable technique for producing PIN diodes in monolithic form, especially those suited for use at microwave frequencies. Such devices have application in microwave monolithic control circuits, beam lead PIN diodes, glass isolated series (PIN) switches on a single chip, and frequency multipliers used in surveillance and theft detection systems. The present invention satisfies this need.

SUMMARY OF THE INVENTION

The present invention resides in a diode that is fabricated in a monolithic semiconductor device and that exhibits desirable PIN diode characteristics. A key feature of the device is that it includes means for insuring that current flowing through the device does not pass through any intrinsic or I region other than an operative I region disposed between N and P regions of the diode. This avoids any degradation of the desirable PIN diode characteristics.

Briefly, and in general terms, the device of the invention comprises a PIN diode fabricated in a monolithic device having an I layer overlying a substrate of a selected polarity type. A first electrode contact makes a direct connection to the substrate from above the I region, but current flowing between the substrate and this contact is electrically isolated from the I region. Overlying a portion of the I layer is a region of opposite polarity type to the substrate, surmounted by a second electrode also having a contact. To facilitate the use of automatic bonding equipment, the first and second electrode contacts are located substantially in the same plane as each other, even though the regions that form the electrodes are not coplanar.

In one preferred embodiment of the invention, the first electrode is a cathode, the second is an anode, and the substrate is of N-type material. The cathode contact includes a conductive layer that extends from a bonding pad substantially in the same plane as the anode contact, down into an etched-away portion of the structure where it makes contact with the substrate without contacting any I-region material beneath the cathode bonding pad. An insulating layer isolates the conductive layer from the I region. In accordance with one aspect of the invention, the conductive layer may also serve as a fuse that can be open-circuited by applying a pulse of predetermined magnitude, thereby permitting deactivation of the diode if desired.

In another embodiment of the invention, portions of the I region that should not participate in the PIN diode action, i.e. those portions not disposed between the cathode and anode of the device, are removed, such as by etching, prior to formation of the contact establishing electrical connection with the substrate. Whether the unwanted I regions are totally removed or whether they are electrically isolated, a key aspect of the invention is the same. Namely, there must be no I region in contact with electrode metal in the device. Even if an I region were to be short-circuited by conductive metal, its presence would still detract from the desirable performance characteristics of the PIN diode.

It will be appreciated from the foregoing that the present invention represents a significant advance in the field of monolithic semiconductors, in that diode having all the desirable characteristics of PIN diodes is fabricated in a monolithic semiconductor. Other aspects and advantages of the present invention will become apparent from the following more detailed description taken in conjunction with the accompanying drawings.

BRIEF DESCRIPTION OF THE DRAWINGS

FIG. 1 is a sectional view of a monolithic wafer of semiconductor material before fabrication of a PIN diode according to the invention;

FIG. 2 is a top plan view of a PIN diode according to the present invention, fabricated in a monolithic wafer of semiconductor material;

FIG. 3 is a sectional view taken substantially along the line 3—3 of FIG. 2; and FIG. 4 is a sectional view of a diode of the prior art, fabricated in a monolithic wafer of semiconductor material.

DESCRIPTION OF THE PREFERRED EMBODIMENT

The present invention provides a PIN diode fabricated in a monolithic semiconductor device, thereby eliminating the need to employ discrete components in order to benefit from the advantageous characteristics of PIN diodes.

As shown in FIG. 1, a PIN diode is fabricated in a wafer 11 of semiconductor material, which, prior to fabrication of the diode, has an N-type substrate 13 and an overlying intrinsic layer 14, also referred to as an I region. Photomasking and etching techniques are used to remove selected portions of the I-type layer 14 from the substrate 13, thereby forming a cathode mesa 15 having a first I region 17 and an anode mesa 19 having a second I region 21, as shown in FIGS. 2 and 3. The cathode mesa 15 has an upper surface 23, which, as will shortly become clear, is not a true cathode surface. A P-type region 25 is formed in an upper anode surface 27 of the anode mesa 19.

A layer of insulation 29 is formed over the mesas 15 and 19 and the substrate 13. The insulation 29 has a cathode opening 31 located between the mesas 15 and 19 to provide access to the substrate 13. An electrically conductive layer 33 contacts the substrate 13 through the cathode opening 31 and extends across the substrate 13, up one side of the cathode mesa 15, and across the upper surface 23 to form a cathode contact 35. Both the conductive layer 33 and the cathode contact 35 are electrically isolated by the insulation 29 from the cathode mesa 15, from the upper cathode surface 23, and from the substrate 13 everywhere except at the cathode opening 31. In this way, the I region 17 in the cathode mesa 15 is electrically isolated from the diode circuit.

The insulation 29 has an anode opening 37 to provide access to the anode surface 27. A second conductive layer 39 extends from the anode surface 27 through the anode opening 37 to form an anode contact 41. The cathode contact 35 lies in a plane indicated by reference numeral 43, and the anode contact 41 lies in substantially the same plane to facilitate the use of automatic bonding equipment for establishing external connections with the contacts 35 and 41.

The conductive layer 33 optionally includes a fuse region 45 of a relatively narrow cross section, between the cathode opening 31 and the cathode mesa 15. If a current of sufficient magnitude flows through the conductive layer 33, the fuse region 45 melts, interrupting the flow of current and disabling the diode. This feature can be used either as a safety fuse to prevent overloading other components in a circuit that includes the diode, or as a means for disabling the diode by applying to it a pulse of energy large enough t melt the fuse region 45.

In some applications, beam lead PIN diodes may be used, and uniformity of the heights of the anode and cathode contacts may not then be a requirement. In such cases, the advantages of the invention may be obtained by removing the unwanted I regions, instead of electrically isolating them as described with reference to FIGS. 2 and 3. The process of fabricating the device then includes the steps of forming an I region over a semiconductor substrate, such as an N-type substrate, and removing, as by etching, all unwanted portions of the I region except an operative portion to be directly associated with the diode. A P-type region is formed in the remaining I region, and contact layers are deposited on the P-type region and directly on the N-type substrate. Since all but the operative I-region portion are removed, there is no immediate contact between contact metal and an I region, and the device retains the desirable PIN diode characteristics.

An example of a prior attempt to fabricate a PIN diode in a monolithic device is shown in FIG. 4. This embodiment is similar in certain respects to that shown in FIGS. 2 and 3, and for convenience components in FIG. 4 that are similar to components in FIGS. 2 and 3 are assigned the same reference numerals, analogous but changed components are assigned the same reference numerals accompanied by the suffix "A", and different components are assigned different reference numerals.

The prior art device has an N-type substrate 13 and an anode mesa 19 defining an I region 21 and having a P region 25 in its upper surface 27. A conductive layer 39 extends from the upper surface 27 through an opening 37 to form an anode contact 41. The diode also has a cathode mesa 15A defining a first I region 17A and having an upper surface 23A. An opening 47 extends through the I region 17A and a layer of insulation 29A, to provide access to the substrate 13. A conductive layer 33A extends from the substrate 13 through the opening 47 to form a cathode contact 35A on the upper surface 23A of the cathode mesa 15A. Although the insulation 29A isolates the cathode contact 35A from the upper surface 23A, the conductive layer 33A touches the I region 17A in the opening 47.

In a monolithic device embodying the present invention, there is basically only one path 49 (FIG. 3) for an electrical current to follow in entering the diode through the contact 35. The path 49 extends from the conductive layer 33 directly into the substrate 13 at the point where the substrate 13 touches the conductive layer 33 in the opening 31. In the monolithic device according to the prior art, a current having a relatively low frequency likewise can also follow only one path 49A (FIG. 4) from the conductive layer 33A into the substrate 13 at the point where the substrate 13 touches the conductive layer 33A in the opening 47. Even though the conductive layer 33A also touches the adjacent I region 17A in the opening 47, no significant low-frequency current flows through the I region 17A, because the conductive layer 33A short-circuits any alternate current path through the I region 17A. However, at microwave frequencies the conductive layer 33A is not completely effective to short-circuit the I region 17A, and a parallel current path 51 is established from the conductive layer 33A, into the I region 17A at the point where the I region 17A touches the conductive layer 33A in the opening 47, and thence into the substrate 13. The parallel current path 51 interferes with the behavior of the diode to such an extent that the punch-through effect may not be observable at all, even though the diode has an I region 21 between its N-type substrate 13 and its P region 25. Accordingly, the advantageous characteristics of a PIN diode are not realized. The present invention eliminates parallel current paths through any unwanted I regions and hence provides the desired PIN diode characteristics in a monolithic semiconductor device.

It will be appreciated from the foregoing that the present invention represents a significant advance in the field of PIN diodes. In particular, the invention provides a technique for incorporating PIN diodes into monolithic semiconductor devices, without sacrificing the desirable characteristics of discrete PIN diodes. A device according to the present invention also provides a fuse that can be used as a safety feature or as a means to selectively deactivate the device.

Of course, many variations and modifications of the present invention are possible without departing from the spirit and scope of the invention. Accordingly, the invention is not to be limited except as by the appended claims.

I claim:

1. A monolithic PIN diode, comprising:
a substrate having an upper surface and defining a first majority charge region;
a first mesa defining a first I region at the upper surface of the substrate, the first mesa having an upper surface;
a second mesa defining a second I region on the upper surface of the substrate, the second mesa having an upper surface;
a second majority charge region formed adjacent to the upper surface of the second mesa, having opposite polarity to that of the first majority charge region and separated therefrom by the second I region;
a layer of insulation covering the mesas and the exposed areas of the upper surface of the substrate, the insulation having a first opening located between the first and second mesas to provide access to the substrate, and a second opening to provide access to the upper surface of the second mesa; and
an electrically conductive layer for establishing an electrical connection with the substrate, the conductor extending from the substrate through the first opening and thence across the substrate, up a side of the first mesa, and across the upper surface thereof to form a contact, the conductive layer and the contact being electrically isolated by the layer of insulation from the substrate and from the sides and upper surface of the first mesa everywhere except at the first opening.

2. A monolithic PIN diode according to claim 1, and further comprising:
means for interrupting an electrical current flowing through the conductive layer when the current reaches a predetermined magnitude.

3. A monolithic PIN diode according to claim 2, wherein:
the means for interrupting the current includes a region of small cross section within the conductive layer.

4. A monolithic PIN diode according to claim 1, and further comprising:
a second conductive layer for establishing an electrical connection with the upper surface of the second mesa, the second conductor extending from the upper surface of the second mesa through the second opening, to define a second contact that is substantially coplanar with the first one.

5. A monolithic PIN diode comprising:
an N-type substrate having an upper surface and defining an N region;
a cathode mesa defining a first I region on the upper surface of the substrate, the mesa also having an upper surface;
an anode mesa defining a second I region on the upper surface of the substrate, the mesa having an anode surface;
a P region formed within the anode mesa at its upper surface, and separated from the N region by the second I region;
a layer of insulation covering the mesas and the exposed areas of the upper surface of the substrate, the insulation having a cathode opening located between the mesas to provide access to the substrate and an anode opening to provide access to the anode surface; and
an electrically conductive layer for establishing an electrical connection with the substrate, the conductive layer extending from the substrate through the cathode opening and thence across the substrate, up a side of the cathode mesa, and across its upper surface to form a cathode contact, the conductive layer and the cathode contact being electrically isolated by the insulation from the cathode mesa, from the upper cathode-mesa surface, and from the substrate everywhere except at the cathode opening.

6. A monolithic PIN diode according to claim 5, and further comprising:
means for interrupting an electrical current flowing through the conductive layer when that current reaches a predetermined magnitude.

7. A monolithic PIN diode according to claim 6, wherein:
the means for interrupting the current includes a small-cross-section portion of the conductive layer.

8. A monolithic PIN diode according to claim 5, wherein:
a portion of the conductor has a predetermined cross section defining a fuse that melts in response to a current flow of a predetermined magnitude.

9. A monolithic PIN diode according to claim 5, and further comprising:
another conductive layer for establishing electrical connection with the anode surface, the layer extending from the anode surface through the anode opening to form an anode contact lying substantially within the same plane as the cathode contact.

10. A monolithic PIN diode, comprising:
a body of semiconductor material of a first conductivity type for providing a first majority charge region;
first and second I regions on a surface of said body in spaced apart relationship;
a region of second conductivity type formed adjacent to a surface of one of said I regions, said region of second conductivity type providing a second majority charge region;
a first electrical contact connected to said body of semiconductor material, said first contact including a portion extending adjacent to the other of said I regions;

a second electrical contact connected to said region of second conductivity type; and means for ensuring that current flowing between the contacts and within the diode passes through no I region other than the one disposed between said body and said region of second conductivity type.

11. A monolithic PIN diode according to claim 10, further comprising means integral to the diode for interrupting the current flowing between the contacts when that current reaches a predetermined magnitude.

12. A monolithic PIN diode according to claim 10, wherein the means for interrupting the current includes a conductive region of small cross section between one of the contacts and its associated majority charge region.

* * * * *